United States Patent
Klausmann et al.

(10) Patent No.: US 7,193,364 B2
(45) Date of Patent: Mar. 20, 2007

(54) ENCAPSULATION FOR ORGANIC DEVICES

(75) Inventors: Hagen Klausmann, Penang (MY); Yuen Sin Lew, Penang (MY); Hou Siong Tan, Port Dickson (MY); Hooi Bin Lim, Penang (MY)

(73) Assignee: Osram Opto Semiconductors (Malaysia) Sdn. Bhd, Penang (MY)

( * ) Notice: Subject to any disclaimer, the term of this patent is extended or adjusted under 35 U.S.C. 154(b) by 0 days.

(21) Appl. No.: 10/242,266

(22) Filed: Sep. 12, 2002

(65) Prior Publication Data

US 2004/0051449 A1    Mar. 18, 2004

(51) Int. Cl.
*H01L 51/00* (2006.01)
*H05B 33/04* (2006.01)

(52) U.S. Cl. .............. 313/512; 313/504; 313/553; 313/554

(58) Field of Classification Search .......... 313/504, 313/506, 509, 511, 512, 553, 554, 555; 428/690, 428/917
See application file for complete search history.

(56) References Cited

U.S. PATENT DOCUMENTS

| | | | |
|---|---|---|---|
| 5,018,048 A | 5/1991 | Shaw et al. | |
| 5,032,472 A | 7/1991 | Michel et al. | |
| 5,079,200 A | 1/1992 | Jackson | |
| 5,107,174 A | 4/1992 | Galluzzi et al. | |
| 5,125,138 A | 6/1992 | Shaw et al. | |
| 5,192,240 A | 3/1993 | Komatsu | |
| 5,508,586 A * | 4/1996 | Martelli et al. | 313/560 |
| 5,520,564 A | 5/1996 | DeMars | |
| 5,652,067 A | 7/1997 | Ito et al. | |
| 5,686,360 A | 11/1997 | Harvey, III et al. | |
| 5,701,055 A | 12/1997 | Nagayama et al. | |
| 5,725,909 A | 3/1998 | Shaw et al. | |
| 5,731,661 A | 3/1998 | So et al. | |
| 5,757,126 A | 5/1998 | Harvey, III et al. | |
| 5,771,562 A | 6/1998 | Harvey, III et al. | 29/592.1 |
| 5,811,177 A * | 9/1998 | Shi et al. | 428/209 |
| 5,844,363 A * | 12/1998 | Gu et al. | 313/506 |
| 5,855,994 A | 1/1999 | Biebuyck et al. | |
| 5,874,804 A | 2/1999 | Rogers | |
| 5,882,761 A | 3/1999 | Kawami et al. | 428/69 |
| 5,895,228 A | 4/1999 | Biebuyck et al. | |
| 5,936,342 A * | 8/1999 | Ono et al. | 313/495 |

(Continued)

FOREIGN PATENT DOCUMENTS

EP    0776147    8/2001

(Continued)

OTHER PUBLICATIONS

Werner Espe, Max Knoll, Marshall P. Wilder, "Getter Materials for Electron Tubes", Oct. 1950, Electronics, p. 80-86.

(Continued)

*Primary Examiner*—Karabi Guharay
(74) *Attorney, Agent, or Firm*—Fish & Richardson P.C.

(57) ABSTRACT

A method of encapsulating devices including providing a getter layer in the penetration path of atmospheric elements. The getter layer serves as a barrier to potentially deleterious atmospheric components, such as moisture and gases, that penetrate the device. In one embodiment, the getter layer surrounds an active region where active component or components are formed.

39 Claims, 4 Drawing Sheets

U.S. PATENT DOCUMENTS

| | | | |
|---|---|---|---|
| 5,945,174 A | 8/1999 | Shaw et al. | |
| 5,977,895 A | 11/1999 | Murota et al. | |
| 6,005,692 A | 12/1999 | Stahl | |
| 6,010,751 A | 1/2000 | Shaw et al. | |
| 6,023,125 A | 2/2000 | Yoshikawa et al. | |
| 6,042,443 A | 3/2000 | Carella et al. | |
| 6,049,167 A | 4/2000 | Onitsuka et al. | |
| 6,080,031 A * | 6/2000 | Rogers et al. | 445/25 |
| 6,081,071 A | 6/2000 | Rogers | |
| 6,083,628 A | 7/2000 | Yializis | |
| 6,099,746 A | 8/2000 | Kim | |
| 6,104,138 A | 8/2000 | Martelli et al. | |
| 6,137,220 A | 10/2000 | Nagayama et al. | |
| 6,177,352 B1 | 1/2001 | Schönfeld et al. | |
| 6,198,217 B1 | 3/2001 | Suzuki et al. | |
| 6,198,220 B1 | 3/2001 | Jones et al. | |
| 6,210,815 B1 | 4/2001 | Ooishi | |
| 6,214,422 B1 | 4/2001 | Yializis | |
| 6,214,474 B1 | 4/2001 | Barbist et al. | |
| 6,215,245 B1 | 4/2001 | Mori | |
| 6,218,004 B1 | 4/2001 | Shaw et al. | |
| 6,221,456 B1 * | 4/2001 | Pogorski et al. | 428/69 |
| 6,224,948 B1 | 5/2001 | Affinito | |
| 6,228,436 B1 | 5/2001 | Affinito | |
| 6,231,939 B1 | 5/2001 | Shaw et al. | |
| 6,232,178 B1 | 5/2001 | Yamamoto | |
| 6,259,204 B1 | 7/2001 | Ebisawa et al. | |
| 6,278,234 B1 * | 8/2001 | Ono et al. | 313/495 |
| 6,563,262 B1 | 5/2003 | Cao | |
| 6,565,770 B1 | 5/2003 | Mayer et al. | |
| 6,566,808 B1 | 5/2003 | Duggal et al. | |
| 6,572,784 B1 | 6/2003 | Coombs et al. | |
| 6,605,893 B2 * | 8/2003 | Ando | 313/495 |
| 6,614,057 B2 * | 9/2003 | Silvernail et al. | 257/99 |
| 6,617,611 B2 * | 9/2003 | Hasegawa et al. | 257/59 |
| 6,620,513 B2 * | 9/2003 | Yuyama et al. | 428/416 |
| 6,621,840 B2 | 9/2003 | Araki | |
| 6,628,086 B2 | 9/2003 | Hayashi et al. | |
| 6,652,343 B2 | 11/2003 | Hasegawa et al. | |
| 6,693,296 B1 | 2/2004 | Tyan | |
| 6,699,728 B2 | 3/2004 | Guenther et al. | |
| 6,798,133 B1 | 9/2004 | Ambrugger et al. | |
| 6,887,733 B2 | 5/2005 | Klausmann et al. | |
| 6,888,307 B2 * | 5/2005 | Silvernail et al. | 313/512 |
| 6,911,667 B2 | 6/2005 | Pichler et al. | |
| 2001/0013756 A1 | 8/2001 | Mori et al. | |
| 2002/0015818 A1 | 2/2002 | Takahashi et al. | |
| 2002/0033667 A1 | 3/2002 | Yamashita | |
| 2003/0038590 A1 * | 2/2003 | Silvernail et al. | 313/504 |
| 2003/0058192 A1 * | 3/2003 | Arai et al. | 345/59 |
| 2003/0094607 A1 | 5/2003 | Guenther et al. | |
| 2003/0117068 A1 | 6/2003 | Forrest et al. | |
| 2003/0197197 A1 | 10/2003 | Brown et al. | |
| 2003/0205845 A1 | 11/2003 | Pichler et al. | |
| 2003/0207500 A1 | 11/2003 | Pichler | |
| 2003/0209979 A1 | 11/2003 | Guenther et al. | |
| 2003/0214232 A1 | 11/2003 | Guenther et al. | |
| 2004/0036411 A1 | 2/2004 | Kim et al. | |
| 2004/0046500 A1 | 3/2004 | Stegamat | |
| 2004/0048033 A1 | 3/2004 | Klausmann et al. | |
| 2004/0048037 A1 | 3/2004 | Klausmann et al. | |
| 2004/0108811 A1 | 6/2004 | Klausmann et al. | |

FOREIGN PATENT DOCUMENTS

| | | |
|---|---|---|
| WO | WO00/36661 | 6/2000 |
| WO | WO00/36665 | 6/2000 |
| WO | WO 00/76276 A1 | 12/2000 |
| WO | WO 01/18886 A2 | 3/2001 |
| WO | WO 01/19142 A1 | 3/2001 |

OTHER PUBLICATIONS

Sato, Y. et al., "Stability of Organic Electroluminescent Diodes," Molecular Crystals and Liquid Crystals, vol. 253, 1994, pp. 143-150.

* cited by examiner

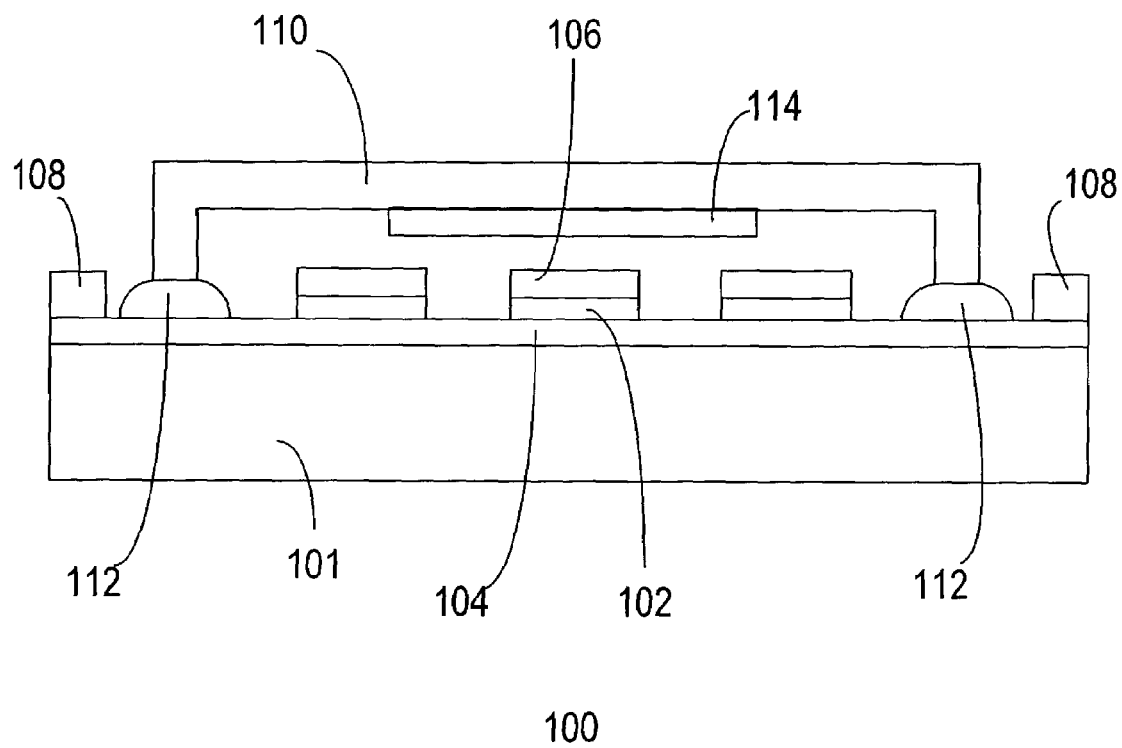

ENCAPSULATION FOR ORGANIC DEVICES

CROSS REFERENCE TO RELATED APPLICATIONS

This application is related to the following applications being filed concurrently: U.S. Ser. No. 10/242,068 now U.S. Pat. No. 6,887,733, entitled "METHOD OF FABRICATING ELECTRONIC DEVICES" by Hagen Klausmann and Bernd Fritz; U.S. Ser. No. 10/242,004, entitled "OLED DEVICES WITH IMPROVED ENCAPSULATION" by Hagen Klausmann and Bernd Fritz; and U.S. Ser. No. 10/242,656, entitled "ACTIVE ELECTRONIC DEVICES" by Reza Stegamat. All of these applications are incorporated by reference herein in their entirety.

Field of Invention

The invention relates to the encapsulation of devices. More particularly, the invention relates to improved encapsulation of devices, such as organic light emitting diodes (OLEDs), which require protection from moisture, gases or other atmospheric elements.

BACKGROUND OF INVENTION

Various types of devices may require hermetic sealing to protect the active components from atmospheric elements, such as moisture and/or gases. For example, devices which include organic active elements such as OLEDs require protection from moisture or gases. OLED devices can serve as displays for various types of consumer electronic products, such as automobile stereo displays, cellular phones, cellular smart phones, personal organizers, pagers, advertising panels, touch screen displays, teleconferencing and multimedia products, virtual reality products and display kiosks.

Referring to FIG. 1, a conventional OLED device is shown. The OLED device comprises a functional stack formed on a substrate 101. The functional stack comprises one or more organic functional layers 102 between two conductive layers (104 and 106) which serve as electrodes. The conductive layers are patterned to form rows of cathodes in a first direction and columns of anodes in a second direction. OLED cells are located in the active region where the cathodes and anodes overlap. Charge carriers are injected through the cathodes and anodes via bond pads 108 for recombination in the functional organic layers. The recombination of the charge carriers causes the functional layers of the cells to emit visible radiation.

Active components, such as the cathode and organic layers in organic devices are adversely impacted by potentially deleterious components such as water, oxygen and other gaseous components. One approach is to hermetically encapsulate the device with a cap 110, sealing the cells. Typically, an epoxy based sealant 112 is used to bond the cap to the substrate. However, the sealant can be penetrated by potentially deleterious components such as moisture, oxygen and other gases. Small amounts of such deleterious components can be trapped in the encapsulation during the sealing process. Additionally, such deleterious components may diffuse into the encapsulation over time. This can adversely impact the reliability of the OLED device.

To improve the sealing of the encapsulation, a drying agent 114, such as barium oxide, calcium oxide or sodium oxide directly above the active region where the active components are located. However, the penetration path of moisture, oxygen and other gases from the atmosphere is along the interface of the cap and substrate, where the sealant 112 is located. By locating the drying agent away from penetration path, small amounts of water and gases can escape sorption and react with the active components, thus degrading the life expectancy of the organic device.

As evidenced from the foregoing discussion, it is desirable to provide an improved encapsulation to prevent degradation in performance and increase the lifetime of a device.

SUMMARY OF THE INVENTION

The invention relates to improved encapsulation of devices, particularly those which require protection from moisture and reactive gases. The device comprises a substrate having an active region defined thereon, one or more active components formed thereon, and a cap encapsulating the device to protect the active components. In one embodiment, a getter layer is provided surrounding the active region to form a getter ring. The getter ring comprises a material which absorbs atmospheric elements. The getter ring, thus is located between the penetration path of the atmospheric elements through the encapsulation and the active region. This reduces the likelihood of atmospheric elements diffusing to the active components, which can degrade or render the device defective. In another embodiment, the getter ring is provided on a cap that seals the device.

BRIEF DESCRIPTION OF THE DRAWINGS

FIG. 1 shows a conventional OLED device;

DETAILED DESCRIPTION OF PREFERRED EMBODIMENTS

Figure 2A:
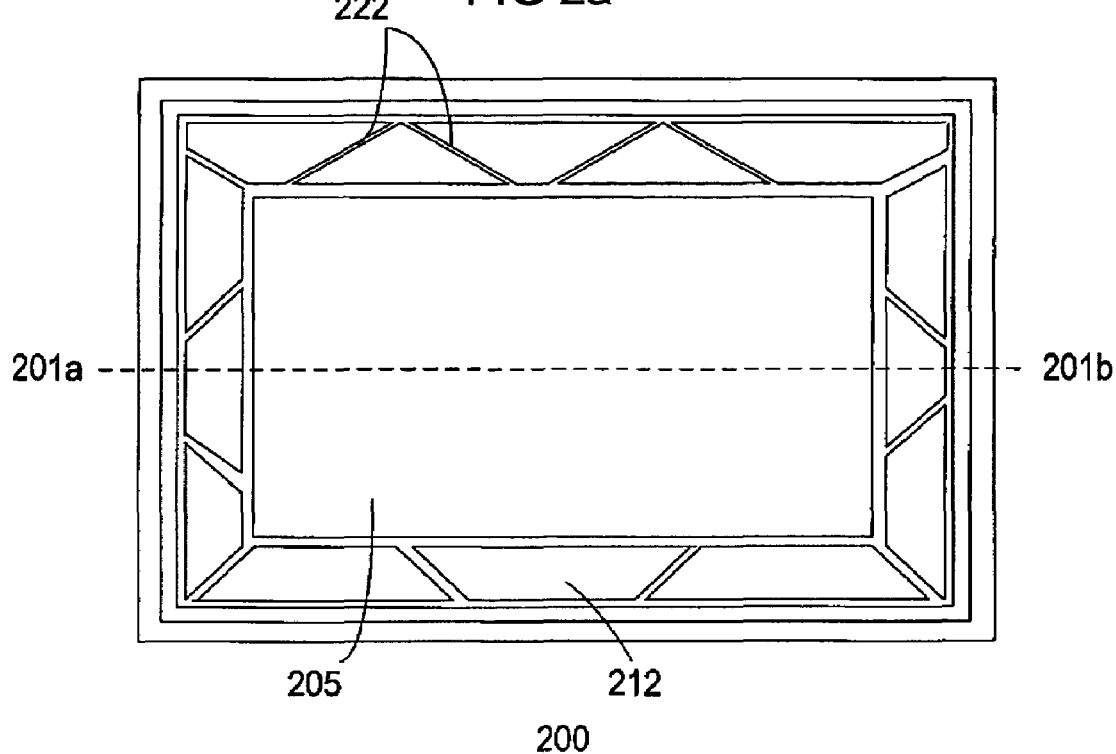
FIGS. 2a and 2b show planar and cross-sectional views of a device in accordance to one embodiment of the invention.
Figure 2B:
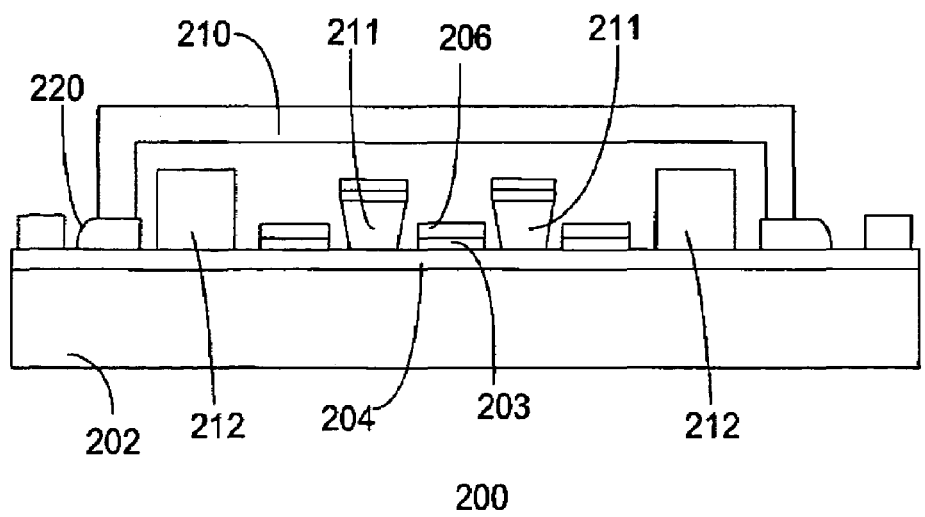

The invention relates to improved encapsulation of devices to protect the materials of the active component or components from atmospheric elements such as moisture and/or gases. FIGS. 2a–b show planar and cross-sectional (along line 201) views of a device in accordance with one embodiment of the invention. In one embodiment, the device 200 comprises a substrate 202 having an active region 205 defined thereon. The substrate comprises, for example, glass. Materials, such as silicon or other semiconductor materials, are also useful. To form flexible devices, materials such as plastics, can be used. Various other materials, which can provide sufficient mechanical stability for forming the device, are also useful.

As shown, the active region comprises a rectangular shape. Other geometric shapes, depending on the application, are also useful. The active region comprises one or more active components of the device. In one embodiment, the active components include materials which can be adversely impacted by atmospheric elements. For example, the active components comprise organic materials which require protection from moisture and/or atmospheric gases. The organic materials, for example, are conductive polymers or molecules. The organic materials are used to form electronic components, such as transistors, to form circuitry for different electronic applications, such as sensors, receivers, displays, or other applications. Other types of materials, such as metals, may also require protection from atmospheric elements. The active components can be used to form various types of devices, such as electrical or electromechanical devices. Forming other types of devices is also useful.

In a preferred embodiment, the active region comprises one or more OLED cells for forming an OLED device. The OLED device can serve as a display or other purposes, such as lighting applications. In one embodiment, the substrate comprises a transparent substrate, such as glass or plastic. The substrate is typically about 0.4–1.1 mm thick. In one embodiment, the substrate comprises a flexible material, such as a plastic film for forming a flexible device. Various commercially available plastic films can be used to serve as the substrate. Such films, for example, include transparent poly(ethylene terephthalate) (PET), poly(butylene terephthalate) (PBT), poly(enthylene naphthalate) (PEN), polycarbonate (PC), polyimides (PI), polysulfones (PSO), and poly (p-phenylene ether sulfone) (PES). Polymeric materials advantageously enable fabrication of devices using a roll-to-roll process. Alternatively, materials such as ultra thin glass (e.g., thickness between 10–100 μm), a composite stack comprising glass and polymer or polymer films coated with inorganic barrier layers can also be used. Other types of materials that can serve as a substrate to support the cells are also useful.

In one embodiment, the OLED cells comprise one or more organic layers 203 sandwiched between lower and upper electrodes. In one embodiment, the lower electrodes 204 are anodes and the upper electrodes 206 are cathodes. Forming lower electrodes that are cathodes and upper electrodes that are anodes is also useful. The organic layers are fabricated from organic compounds that include, for example, conjugated polymers, low molecular materials, oligomers, starburst compounds or dendrimer materials. Such materials include tris-(8-hydroxyquinolate)-aluminum (Alq), poly(p-phenylene vinylene) (PPV) or polyfluorene (PF). Other types of functional organic layers, including fluorescence or phosphorescence-based layers, are also useful. The thickness of the organic layer or layers is typically about 2–200 nm.

The anodes are formed from a conductive material. In one embodiment, the conductive material comprises a transparent conductive material such as indium-tin-oxide (ITO). Other transparent conductive materials, for example, indium-zinc-oxide, zinc-oxide or tin-oxide, are also useful. In one embodiment, the cathodes comprise, for example, low work function metals such as lithium (Li), calcium (Ca), magnesium (Mg), aluminum (Al), silver (Ag) and/or barium (Ba), or a mixture or alloy thereof. These metals are highly reactive with water and gaseous content in the atmosphere and must be protected to provide reliability and prolong the useful life span of the device. A thin electron-injecting layer may be provided between the cathode metal and the organic layer for improving, for example, the drive voltage and luminescence efficiencies. The electron-injecting layer comprises, for example, a metal or alloy, or a dielectric compound. These include $CsF$, $Cs_2O$, $NaF$, $MgF_2$, $NaCl$, $KCl$, $K_2O$ or $RbCl$.

Various deposition techniques, such as thermal evaporation, may be used to deposit the electrodes. In one embodiment, the electrodes are patterned as strips in, for example, passive-matrix display applications. In one embodiment, pillars 211 are provided on the substrate surface to pattern the device layers as desired to create separate OLED cells. Other methods of patterning the device layers, including photolithography and etching, are also useful.

Typically, the upper and lower electrodes are patterned in first and second directions that are orthogonal to each other. The intersections of the upper and lower electrodes form the OLED cells or pixels. Pixels are addressed by applying a voltage to corresponding rows and columns. Alternatively, the OLED display comprises an active-matrix display. The active-matrix display comprises pixels that are independently addressed by thin-film-transistors (TFTs) and capacitors formed in an electronic backplane. Bond pads or electrical contacts 208 are electrically coupled to the cathodes and anodes.

In one embodiment, pillars 211 are provided on the substrate surface to pattern the device layers as desired to create separate OLED cells. For example, the pillars are arranged in a second direction to pattern the upper electrode layer to form an array of OLED cells. Pillars which create other patterns for the upper electrodes are also useful. OLED cells are located between the pillars where the upper electrodes overlap the lower electrodes.

The profile of the pillars, in one embodiment, comprises an undercut, which results in structures wider at the top than at the bottom. The profile of the pillars, in one embodiment, comprises tapered sides to provide the undercut. The taper angle is, for example, about 30–75 degrees from horizontal. Other types of profiles, such as t-shaped profiles, are also useful. The height of the pillars is about 1–10 μm and preferably about 2–5 μm. The pillars typically comprise a resist or resin. Various patterning methods such as photolithography, etching and electron curing may be used to form pillars with the desired cross-section.

A cap 210 is provided to hermetically seal the device. The cap, in one embodiment, comprises glass. Other materials, such as metal, ceramic or plastics, can also be used. The cap can be preformed using various techniques, such as etching or stamping, depending on the type of material used. Alternatively, the cap can be a substrate having support posts formed thereon. The support post can be formed by depositing a layer of material and patterning it. Various types of materials, including photosensitive and non-photosensitive materials, such as resist, polyimide, silicon dioxide, can be used. Preferably, the material used is non-conductive. Depending on whether a photosensitive or non-photosensitive material is used, the layer is directly or indirectly patterned with a mask layer. Alternatively, the posts can be formed by selective deposition using, for example, a shadow mask.

In one embodiment, the cap is mounted onto a bonding region of the substrate. In one embodiment, a protective layer can be provided in the bonding region to protect the layers beneath. In a preferred embodiment, the protective layer comprises an insulating material. The use of an insulating material is useful to prevent shorting of conducting lines which provide electrical access to the device. For some applications, a dielectric protective layer may be required in the bonding region to prevent conductive lines on the substrate in the bonding region from being shorted when a conductive cap or conductive post is used. The protective layer comprises, for example, photoresist or photosensitive polyimide. The use of a protective layer in the bonding region is described in copending patent application "Improved Encapsulation for Electroluminescent Devices", U.S. Ser. No. 10/142,208 filed on May 7, 2002, which is herein incorporated by reference for all purposes. Alternatively, other dielectric materials, such as silicon oxide, silicate glass, or silicon nitride, are also useful. If an insulating material is not required, a conductive material can be used to form the protective layer.

To bond the cap to the bonding region, a sealant 220 is applied around or on the cap. The sealant, for example, comprises UV-curable epoxy. Other types of sealants such as heat curable epoxy or acrylates are also useful. The sealant, for example, is cured (e.g., UV or thermal), thus sealing the OLED device 200. The sealant, however, may be porous to the surrounding moisture and gases in the atmosphere. Small amounts of such potentially deleterious atmospheric components may be trapped in the device or diffuse through the sealant over time.

In accordance to the invention, a getter ring 212 is provided in a getter region surrounding the circumference of the active region, forming a getter ring between the active region and the cap bonding region. In one embodiment, the getter ring is formed on the substrate in the area surrounding the active region. The getter ring comprises a material that absorbs moisture and/or other atmospheric elements such as gases. In one embodiment, the getter ring comprises alkaline earth metals, such as aluminum (Al), magnesium (Mg), zirconium (Zr), calcium (Ca), tantalum (Ta) or barium (Ba). Preferably, the getter ring comprises barium. Oxides or alloys of alkaline earth metals can also be used to form the getter ring. Other types of getter materials are also useful. In another embodiment, the getter material comprises an inorganic compound such as zeolite. Other types of compounds are also useful. The use of various types of commercial getter materials, such as STAYDRY® from Cookson Semiconductor Packaging Materials or Drierite® from W A Hammond Drierite Co Ltd, is also useful.

Since the absorption characteristics of the getter ring depends on the volume of getter material, the dimensions (e.g., width and thickness or height) of the getter ring would depend on design requirements (e.g., device size and lifetime). In one embodiment, the width of the getter ring is about 1–3 mm. Other widths are also useful. However, the wider the ring, the bigger the device would be. The thickness, in one embodiment, is equal to or less than the height of the cavity formed by the cap. The thickness, for example, is about 3–30 μm. Other heights, depending on the height of the cavity, can also be useful. Alternatively, the dimensions of the device can be determined by the absorption requirements.

In one embodiment, a getter protective layer can be provided on the substrate between the substrate and getter ring. The getter protective layer is useful to protect the layers on the substrate which can be adversely affected by the getter material. In a preferred embodiment, the getter protective layer comprises an insulating material. The use of an insulating material is particularly useful to prevent shorting of, for example, conducting lines on the substrate which provide electrical access to the device. The getter protective layer comprises, for example, photoresist or photosensitive polyimide. Alternatively, other dielectric materials, such as silicon oxide, silicate glass, or silicon nitride, are also useful. If an insulating material is not required, conductive material can be used to form the getter protective layer.

As described, a getter ring is located between the active region and cap bonding region of the device. As the atmospheric elements penetrate the encapsulation through a diffusion path between the cap and substrate, the getter ring absorbs them prior to reaching the active components. This enhances the protection properties of the getter material over conventional techniques. Furthermore, providing the getter material outside of the active region avoids potential interaction with materials of the active components which can degrade or render the device defective.

The getter ring can be formed using various techniques. In one embodiment, the getter material is selectively formed on the substrate in the getter region between the active region and cap bonding region to form the getter ring. A shadow mask can be used to selectively deposit the getter material onto the substrate. When a shadow mask is used, the getter ring may not be contiguous. For example, the getter ring can comprise a plurality of getter patches separated by channels 222, as shown in FIG. 2a. The channels correspond to the hinges of the shadow mask that connect the edges of the mask to the central portion of the mask which protects the active region. The hinges can have various patterns.

In one embodiment, the hinges connect the edges of the mask and the central portion at an angle, for example, 45°. Providing hinges having other angles or patterns are also useful. Connecting the hinges at an angle increases the length of the penetration path of atmospheric elements to greater than the actual width of the getter ring. This advantageously increases the likelihood that the atmospheric elements which penetrated the encapsulation are absorbed by the getter ring before reaching the active region. In a preferred embodiment, the channels are formed with a pattern which extends the length of the penetration path of atmospheric elements beyond the actual width of the getter ring without affecting the mechanical stability of the mask or getter ring. Furthermore, the pattern of the channels is selected to enhance manufacturability (e.g., ease of handling and maintenance).

Figure 3A:
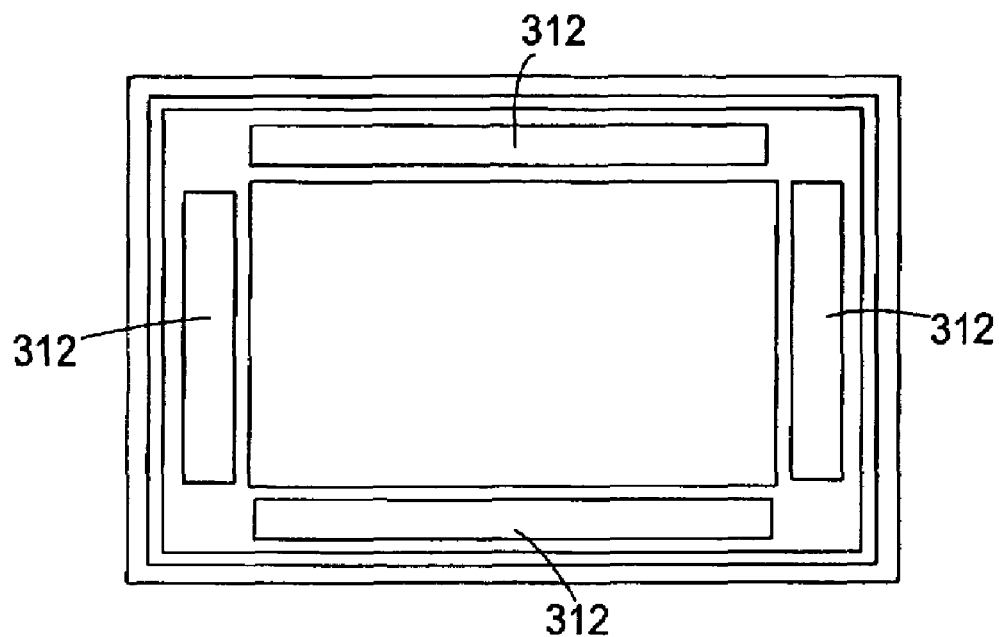
FIGS. 3a–b show planar views of devices in accordance with different embodiments of the invention.
Figure 3B:
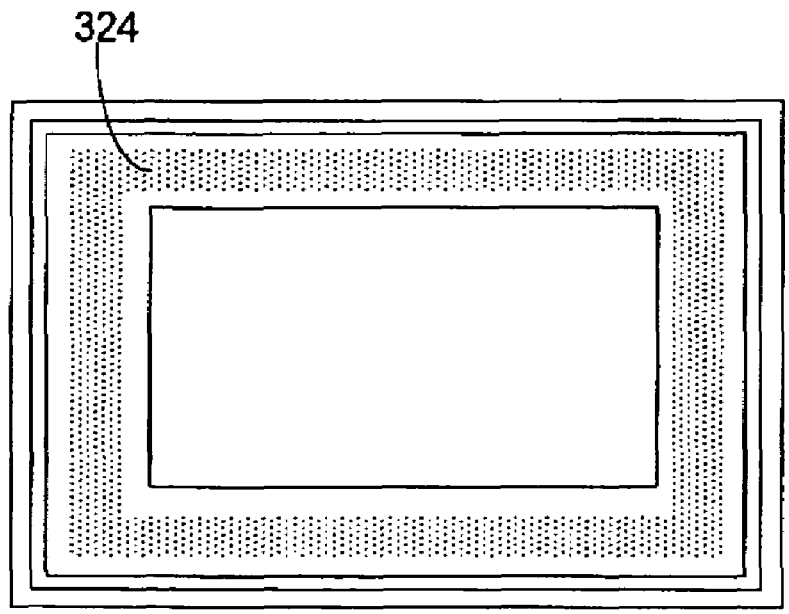

FIG. 3a–b shows alternative patterns of the channels (e.g., pattern of the shadow mask) of the getter ring. Referring to FIG. 3a, the getter ring comprises a plurality of rectangular blocks 312. In one embodiment, a block is adjacent to a side of the active region. In the case where the active region is rectangular in shape, four blocks 312a–d are provided. Providing multiple blocks for each side is also useful. As shown in FIG. 3b, the pattern of the hinges of the shadow mask 324 in the getter ring region is comparable to a mask having numerous fine openings. The openings can have various geometric shapes. For example, the openings can have a circular, elliptical, square, rectangular, or other polygonal shape. Preferably, the width of the channels should be sufficiently small to ensure absorption of the atmospheric elements by the getter ring. It is understood that not all the openings have to be the same shape or size. As a result, the getter ring comprises a plurality of posts formed from the getter material. The posts are represented by the dots in the getter ring (the dots are not necessarily drawn to scale or shape).

The getter material can be deposited using various techniques. In one embodiment, the getter material is deposited by evaporation, such as thermal or electron beam. Sputtering techniques can also be used to deposit the getter material. Preferably, the getter material is deposited by flash evaporation. Flash evaporation techniques are described in, for example, concurrently filed patent application titled "Method of Fabricating Electronic Devices" U.S. Ser. No. 10/242,068, which is herein incorporated by reference for all purposes.

Various other deposition techniques can also be used to deposit the getter material. Such techniques include, for example, spray coating or screen printing, which deposit the getter material in a liquid or paste form. Also, printing techniques which do not need a shadow mask, such as ink-jet or flexographic techniques, are also useful. The getter material can be hardened by a curing process such as UV, vacuum treatment, or a combination thereof. Other techniques such as, forming the getter material in solid form using, for example, getter tape or film, are also useful.

In an alternative embodiment, the getter material is deposited as a blanket layer and patterned to form the getter ring using, for example, a photoresist mask. Such a technique is particularly useful for applications where the patterning process does not adversely affect the active components.

In another embodiment, a getter layer can also be formed on the inner surface of the cap. This advantageously increases the volume of getter material which can be used to absorb the atmospheric elements which have penetrated the encapsulation.

Figure 4:
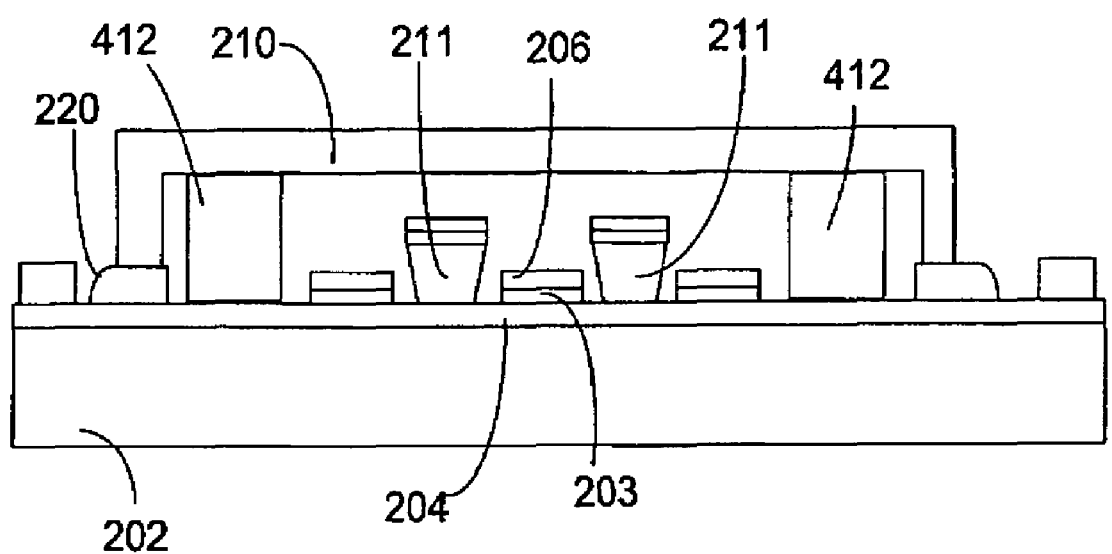
FIG. 4 shows a cross-section of a device in accordance with another embodiment of the invention.

FIG. 4 shows the cross-section of a device in accordance with another embodiment of the invention. The device, for example, comprises a substrate 202 having an active region defined thereon. In one embodiment, the device is an OLED device having OLED cells formed in an active region. Other types of devices are also useful. The device is encapsulated with a cap 210. The cap forms a cavity to protect the active components of the device. In one embodiment, a getter ring 412 is formed on the cap corresponding to the area between the active region and the cap.

As previously described, the dimensions of the getter ring may depend on, for example, design specifications. In one embodiment, the height of the getter ring is less than the height of the cavity. Preferably, the height of the getter layer is equal to the height of the cavity. In one embodiment, a dielectric protective layer can be provided, if necessary, to prevent shorting of conductive lines on the substrate.

The getter ring can be formed from various materials which can absorb atmospheric elements. Various techniques can be used to form the getter ring. Such materials and deposition techniques, for example, include those which have already been described. Optionally, to enhance the absorption characteristics of the getter ring, a getter layer can be formed on the inner surface of the cap, for example, corresponding to the active region.

The invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A device comprising:
 a substrate having an active region defined on the substrate, wherein the active region includes an active component;
 a getter periphery structure on the substrate and formed of a getter material, the getter periphery structure surrounding a perimeter of the active region; and
 a cap bonded to a cap bonding region on the substrate, surrounding the getter periphery structure, to encapsulate the active region, wherein a cavity is created between the cap and the substrate;
 wherein the getter periphery structure is located in the cavity and includes a plurality of getter patches separated by areas free of getter material, the areas free of getter material forming at least one penetration path for atmospheric elements to pass through the getter periphery structure, the areas free of getter material being configured such that a length of the penetration path is greater than a width of the getter periphery structure.

2. The device of claim 1 wherein the active component comprises at least one OLED cell to form an OLED device.

3. The device of claim 1 wherein the active component comprises organic material.

4. The device of claim 1 wherein the substrate comprises a flexible substrate.

5. The device of claim 4 wherein the active component comprises at least one OLED cell to form an OLED device.

6. The device of claim 4 wherein the active component comprises organic material.

7. The device of claim 1 wherein the getter material absorbs moisture or atmospheric elements or a combination thereof.

8. The device of claim 7 wherein the getter material is selected from a zeolite, an alkaline earth metal, an oxide or alloy of an alkaline earth metal or a combination thereof.

9. The device of claim 7 wherein the getter periphery structure comprises a height less than or equal to the height of the cavity.

10. The device of claim 9 wherein the getter material is selected from a zeolite, an alkaline earth metal, an oxide or alloy of an alkaline earth metal or a combination thereof.

11. The device of claim 7 further comprising a getter layer formed on an inner surface of the cap in an area corresponding to the active region.

12. The device of claim 11 wherein the getter material is selected from a zeolite, an alkaline earth metal, an oxide or alloy of an alkaline earth metal or a combination thereof.

13. The device of claim 7 further comprising a protective layer between the getter periphery structure and the substrate in the getter region.

14. The device of claim 13 wherein the getter material is selected from a zeolite, an alkaline earth metal, an oxide or alloy of an alkaline earth metal or a combination thereof.

15. The device of claim 7 further comprising an insulating protective layer between the getter periphery structure and the substrate in the getter region.

16. The device of claim 1 wherein the getter patches comprise different sizes or shapes and the areas free of getter material correspond to hinges of a shadow mask used in forming the getter periphery structure.

17. The device of claim 16 wherein the getter material is selected from a zeolite, an alkaline earth metal, an oxide or alloy of an alkaline earth metal or a combination thereof.

18. A device comprising:
 a substrate having
  an active region defined thereon, the active region comprising an active component,
  a cap bonding region surrounding the active region, and
  a getter region between the active region and the cap bonding region, the getter region surrounding the perimeter of the active region;
 a cap bonded to the substrate in the cap bonding region to encapsulate the active region; and
 a getter periphery structure formed on the cap located in an area corresponding to the getter region, wherein the getter periphery structure surrounds the perimeter of the active region and comprises a plurality of getter patches separated by channels corresponding to hinges of a shadow mask used for forming the getter periphery structure where a penetration path of atmospheric elements through one of the channels in the getter periphery structure comprises a length which is greater than a width of the getter periphery structure.

19. The device of claim 18 wherein the getter patches comprise different shapes or sizes or a combination thereof.

20. The device of claim 19 wherein a material for the getter periphery structure is selected from a zeolite, an alkaline earth metal, an oxide or alloy of an alkaline earth metal or a combination thereof.

21. The device of claim 18 wherein a material for the getter periphery structure is selected from a zeolite, an alkaline earth metal, an oxide or alloy of an alkaline earth metal or a combination thereof.

22. A device comprising:
a substrate having
an active region defined thereon, the active region comprising an active component,
a cap bonding region surrounding the active region, and
a getter region between the active region and the cap bonding region, the getter region surrounding the perimeter of the active region;
a getter periphery structure formed on the getter region on the substrate wherein the getter periphery structure surrounds the perimeter of the active region and comprises a plurality of getter patches separated by channels corresponding to hinges of a shadow mask used for forming the getter periphery structure where a penetration path of atmospheric elements through one of the channels in the getter periphery structure comprises a length which is greater than a width of the getter periphery structure; and
a cap bonded to the substrate in the cap bonding region to encapsulate the active region.

23. A method of fabricating a device, comprising:
providing a substrate having an active region defined on the substrate,
forming a getter periphery structure from a getter material, the getter periphery structure surrounding a perimeter of the active region; and
after forming the getter periphery structure, mounting a cap to a cap bonding region of the substrate to encapsulate the active region, wherein the cap forms a cavity between the cap and the substrate and the getter periphery structure is located in the cavity;
wherein the getter periphery structure includes a plurality of getter patches separated by areas free of getter material, the areas free of getter material form penetration paths for atmospheric elements to pass through the getter periphery structure, where the areas are configured such that a length of the penetration path is greater than a width of the getter periphery structure.

24. The method of claim 23 wherein the active region comprises at least one OLED cell to form an OLED device.

25. The method of claim 23 wherein the getter material absorbs moisture or atmospheric elements or a combination thereof.

26. The method of claim 25 wherein the getter material is selected from a zeolite, an alkaline earth metal, an oxide or alloy of an alkaline earth metal or a combination thereof.

27. The method of claim 25 wherein forming the getter periphery structure comprises depositing getter material in solid, liquid, or paste form using evaporation, sputtering, spray coating or printing techniques or a combination thereof.

28. The method of claim 27 wherein the getter material is selected from a zeolite, an alkaline earth metal, an oxide or alloy of an alkaline earth metal or a combination thereof.

29. The method of claim 25 wherein forming the getter periphery structure comprises depositing the getter material by flash evaporation.

30. The method of claim 29 wherein the getter material is selected from a zeolite, an alkaline earth metal, an oxide or alloy of an alkaline earth metal or a combination thereof.

31. The method of claim 23 wherein the getter patches comprise different sizes or shapes and the paths correspond to hinges of a shadow mask used in forming the getter periphery structure.

32. The method of claim 31 wherein the getter material is selected from a zeolite, an alkaline earth metal, an oxide or alloy of an alkaline earth metal or a combination thereof.

33. The method of claim 23 wherein the getter patches comprise different sizes or shapes.

34. The method of claim 33 wherein the getter material is selected from a zeolite, an alkaline earth metal, an oxide or alloy of an alkaline earth metal or a combination thereof.

35. A device comprising:
a substrate having an active region defined on the substrate, the active region comprising an active component;
a cap bonded to the substrate to encapsulate the active region, wherein a cavity is created between the cap and the substrate;
a getter periphery structure located in the cavity and formed from a getter material surrounding a perimeter of the active region, wherein the getter periphery structure includes a plurality of getter patches separated by areas free of getter material, the areas free of getter material forming a penetration path of atmospheric elements through the getter periphery structure comprises a length which is greater than a width of the getter periphery structure and the getter periphery structure has a bottom side adjacent to the substrate and there is a free space between the getter periphery structure and the cap on a side of the getter periphery structure that is opposite to the bottom side;
conductive lines on the substrate providing electrical access to the active component from outside the cap; and
a getter protective layer between the substrate and the getter periphery structure, covering the conductive lines.

36. The device of claim 35, wherein the getter protective layer includes a dielectric material.

37. The device of claim 35, wherein the getter protective layer includes one of silicon oxide, silicate glass or silicon nitride.

38. A device comprising:
a substrate having
an active region defined on the substrate, the active region comprising an active component,
a getter region defined on the substrate, the getter region surrounding the perimeter of the active region, and
a cap bonding region defined on the substrate, the cap bonding region surrounding the getter region;
a cap bonded to the cap bonding region of the substrate to encapsulate the active region, wherein a cavity is created between the cap and the substrate; and
a getter periphery structure located in the cavity and formed either on the substrate in the getter region or on the cap in an area corresponding to the getter region prior to bonding the cap to the substrate, wherein the getter periphery structure is formed from a getter material, the getter periphery structure surrounds the active region and includes a plurality of getter patches separated by areas which are free of getter material, wherein the areas free of getter material are designed such that a penetration path of atmospheric elements through the getter periphery structure comprises a length which is greater than a width of the getter periphery structure.

39. A method of fabricating a device comprising:

providing a substrate having an active region and conductive lines defined on the substrate, the conductive lines in electrical communication with at least one component in the active region;

forming a getter periphery structure of a getter material surrounding a perimeter of the active region, where the getter periphery structure includes a plurality of getter patches separated by areas free of getter material, the areas free of getter material forming a penetration path of atmospheric elements through the getter periphery structure comprises a length which is greater than a width of the getter periphery structure;

forming a getter protective layer between the substrate and the getter periphery structure, covering the conductive lines; and subsequent to forming the getter periphery structure, mounting a cap to the substrate to encapsulate the active region, wherein the cap forms a cavity between the cap and the substrate.

\* \* \* \* \*